United States Patent
Takeda et al.

(10) Patent No.: US 9,537,046 B2
(45) Date of Patent: Jan. 3, 2017

(54) OPTICAL DEVICE WAFER PROCESSING METHOD

(71) Applicant: DISCO CORPORATION, Tokyo (JP)

(72) Inventors: Noboru Takeda, Tokyo (JP); Hiroshi Morikazu, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 14/453,131

(22) Filed: Aug. 6, 2014

(65) Prior Publication Data
US 2015/0044799 A1 Feb. 12, 2015

(30) Foreign Application Priority Data
Aug. 6, 2013 (JP) ................. 2013-163558

(51) Int. Cl.
| | | |
|---|---|---|
| H01L 21/78 | (2006.01) | |
| H01L 21/301 | (2006.01) | |
| B23K 26/53 | (2014.01) | |
| H01L 33/00 | (2010.01) | |
| H01L 21/268 | (2006.01) | |

(52) U.S. Cl.
CPC ....... *H01L 33/0095* (2013.01); *H01L 21/2686* (2013.01); *H01L 21/78* (2013.01)

(58) Field of Classification Search
None
See application file for complete search history.

(56) References Cited

U.S. PATENT DOCUMENTS

| | | | |
|---|---|---|---|
| 2001/0019014 A1* | 9/2001 | Kubota et al. | 204/157.41 |
| 2011/0021004 A1* | 1/2011 | Fukuyo et al. | 438/463 |
| 2011/0027921 A1* | 2/2011 | Hamasaki | H01L 33/0095 438/26 |
| 2012/0145331 A1* | 6/2012 | Gomez et al. | 156/712 |

* cited by examiner

*Primary Examiner* — Pamela E Perkins
(74) *Attorney, Agent, or Firm* — Greer Burns & Crain Ltd.

(57) ABSTRACT

In an optical device wafer processing method, a light emitting layer on the front side of a wafer is removed by applying a pulsed laser beam to the wafer along division lines from the back side of a substrate with the focal point of the beam set near the light emitting layer, thereby partially removing the light emitting layer along the division lines. A shield tunnel is formed by applying the beam to the wafer along the division lines from the back of the substrate with the focal point of the beam set near the front of the substrate. This forms a plurality of shield tunnels arranged along each division line, each shield tunnel extending from the front side of the substrate to the back side thereof. Each shield tunnel has a fine hole and an amorphous region formed around the fine hole for shielding the fine hole.

2 Claims, 9 Drawing Sheets

OPTICAL DEVICE WAFER PROCESSING METHOD

BACKGROUND OF THE INVENTION

Field of the Invention

The present invention relates to an optical device wafer processing method for dividing an optical device wafer into individual optical devices such as light emitting diodes and laser diodes along a plurality of crossing division lines, the optical device wafer being composed of a single crystal substrate such as a sapphire ($Al_2O_3$) substrate and a silicon carbide (SiC) substrate and a light emitting layer formed on the front side of the single crystal substrate, the optical device wafer being partitioned by the division lines to define a plurality of separate regions where the optical devices are respectively formed.

Description of the Related Art

In an optical device fabrication process, a light emitting layer composed of an n-type nitride semiconductor layer and a p-type nitride semiconductor layer is formed on the front side of a single crystal substrate such as a sapphire ($Al_2O_3$) substrate and a silicon carbide (SiC) substrate. The optical device wafer is partitioned by a plurality of crossing division lines to define a plurality of separate regions where a plurality of optical devices such as light emitting diodes and laser diodes are respectively formed, thus constituting an optical device wafer. The optical device wafer is cut along the division lines to thereby divide the plural separate regions where the optical devices are formed from each other, thus obtaining the individual optical devices as chips.

As a method of dividing an optical device wafer along the division lines, there has been tried a laser processing method of applying a pulsed laser beam having a transmission wavelength to the wafer along the division lines in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the division lines in the condition where the focal point of the pulsed laser beam is set inside the wafer to thereby continuously form a modified layer inside the wafer along each division line and next applying an external force to the wafer along each division line where the modified layer is formed to be reduced in strength, thereby dividing the wafer into the individual optical devices (see Japanese Patent No. 3408805, for example).

As another method of dividing an optical device wafer along the division lines, there has been put into practical use a technique including the steps of applying a pulsed laser beam having an absorption wavelength to the wafer along the division lines to thereby form a laser processed groove along each division line by ablation and next applying an external force to the wafer along each division line where the laser processed groove is formed as a break start point, thereby breaking the wafer along each division line (see Japanese Patent Laid-open No. Hei 10-305420, for example).

SUMMARY OF THE INVENTION

In forming a modified layer inside a wafer in the condition where the focal point of a laser beam is set inside the wafer, it is necessary to use a focusing lens having a numerical aperture (NA) of about 0.8. Accordingly, to divide a wafer having a thickness of 300 µm, for example, into individual devices, a plurality of modified layers stacked must be formed along each division line, causing a reduction in productivity.

Further, in the case of applying a pulsed laser beam having an absorption wavelength to a wafer, ablation occurs near the surface of the wafer irradiated with the pulsed laser beam, so that the energy of the pulsed laser beam does not penetrate into the inside of the wafer. Accordingly, the pulsed laser beam must be applied plural times along each division line, causing a reduction in productivity. In addition, debris may scatter in performing the ablation to cause a degradation in quality of the optical devices.

It is therefore an object of the present invention to provide an optical device wafer processing method which can efficiently divide an optical device wafer into individual optical devices along a plurality of crossing division lines and can also prevent a degradation in quality of the optical devices, the optical device wafer being composed of a single crystal substrate and a light emitting layer formed on the front side of the single crystal substrate, the optical device wafer being partitioned by the division lines to define a plurality of separate regions where the optical devices are respectively formed.

In accordance with an aspect of the present invention, there is provided an optical device wafer processing method for dividing an optical device wafer into individual optical devices along a plurality of crossing division lines, the optical device wafer being composed of a single crystal substrate and a light emitting layer formed on the front side of the single crystal substrate, the optical device wafer being partitioned by the division lines to define a plurality of separate regions where the optical devices are respectively formed, the optical device wafer processing method including a numerical aperture setting step of setting the numerical aperture (NA) of a focusing lens for focusing a pulsed laser beam so that the value obtained by dividing the numerical aperture (NA) of the focusing lens by the refractive index (N) of the single crystal substrate falls within the range of 0.05 to 0.2; a light emitting layer removing step of applying the pulsed laser beam to the optical device wafer along the division lines from the back side of the single crystal substrate in the condition where the focal point of the pulsed laser beam is set near the light emitting layer, thereby partially removing the light emitting layer along the division lines; a shield tunnel forming step of applying the pulsed laser beam to the optical device wafer along the division lines from the back side of the single crystal substrate in the condition where the focal point of the pulsed laser beam is set near the front side of the single crystal substrate after performing the light emitting layer removing step, thereby forming a plurality of shield tunnels arranged along each division line, each shield tunnel extending from the front side of the single crystal substrate to the back side thereof, each shield tunnel being composed of a fine hole and an amorphous regions formed around the fine hole for shielding the fine hole; and a dividing step of applying an external force to the optical device wafer after performing the shield tunnel forming step, thereby dividing the optical device wafer into the individual optical devices; the pulsed laser beam being applied in the light emitting layer removing step with an energy smaller than that of the pulsed laser beam to be applied in the shield tunnel forming step in the condition where the focused spots of the pulsed laser beam are overlapped.

Preferably, the energy of the pulsed laser beam to be applied in the light emitting layer removing step is set to 2 to 6 µJ/pulse, and the energy of the pulsed laser beam to be applied in the shield tunnel forming step is set to 30 µJ/pulse or more.

In the optical device wafer processing method according to the present invention, the numerical aperture (NA) of the focusing lens for focusing the pulsed laser beam is set so that the value obtained by dividing the numerical aperture (NA) of the focusing lens by the refractive index (N) of the single crystal substrate falls within the range of 0.05 to 0.2. Thereafter, the light emitting layer removing step is performed in such a manner that the pulsed laser beam is applied to the optical device wafer along the division lines from the back side of the single crystal substrate in the condition where the focal point of the pulsed laser beam is set near the light emitting layer, thereby partially removing the light emitting layer along the division lines. Thereafter, the shield tunnel forming step is performed in such a manner that the pulsed laser beam is applied to the optical device wafer along the division lines from the back side of the single crystal substrate in the condition where the focal point of the pulsed laser beam is set near the front side of the single crystal substrate, thereby forming the plural shield tunnels arranged along each division line, each shield tunnel extending from the front side of the single crystal substrate to the back side thereof, each shield tunnel being composed of a fine hole and an amorphous region formed around the fine hole for shielding the fine hole.

In performing the shield tunnel forming step, the light emitting layer formed on the front side of the single crystal substrate has already been removed along each division line. Accordingly, the light emitting layer forming the optical devices adjacent to the division lines is not damaged in the shield tunnel forming step. Further, in the shield tunnel forming step, the pulsed laser beam is applied to the optical device wafer so as to be focused at the focal point set in the single crystal substrate, thereby forming a shield tunnel extending between the focal point and a beam incident surface to which the pulsed laser beam is applied, the shield tunnel being composed of a fine hole and an amorphous region formed around the fine hole for shielding the fine hole. Accordingly, even when the single crystal substrate has a thickness of 300 µm, for example, the shield tunnel can be formed so as to extend from the beam incident surface (upper surface) to the lower surface of the single crystal substrate. That is, even when the thickness of the single crystal substrate is large, it is sufficient to once apply the pulsed laser beam along each division line, so that the productivity can be greatly improved. Furthermore, no debris is scattered in the shield tunnel forming step, so that it is possible to solve the problem that the optical devices may be degraded in quality.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

The optical device wafer processing method according to the present invention will now be described in more detail with reference to the attached drawings.

Figure 1A:
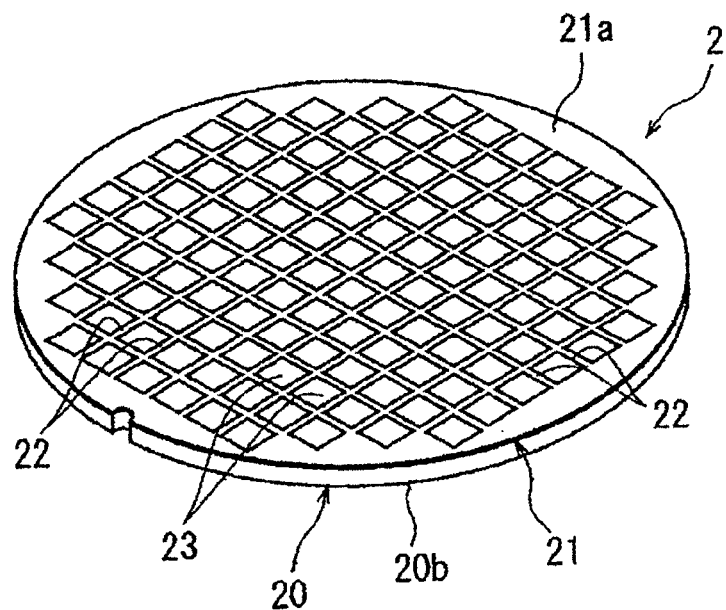
FIG. 1A is a perspective view of an optical device wafer to be processed by the optical device wafer processing method according to the present invention.
Figure 1B:
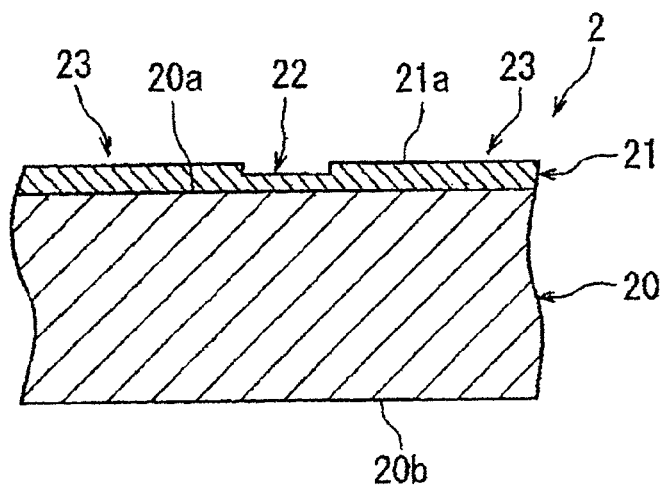
FIG. 1B is an enlarged sectional view showing an essential part of the optical device wafer shown in FIG. 1A.

FIG. 1A is a perspective view of an optical device wafer 2 to be divided into individual optical devices by the optical device wafer processing method according to the present invention, and FIG. 1B is an enlarged sectional view showing an essential part of the optical device wafer 2 shown in FIG. 1A. The optical device wafer 2 shown in FIGS. 1A and 1B is composed of a sapphire substrate 20 as a single crystal substrate having a thickness of 300 µm, for example, and a light emitting layer (epitaxial layer) 21 formed on the front side 20a of the sapphire substrate 20. The light emitting layer (epitaxial layer) 21 is formed of a nitride semiconductor. The light emitting layer (epitaxial layer) 21 is partitioned by a plurality of crossing division lines 22 to thereby define a plurality of separate regions where a plurality of optical devices 23 such as light emitting diodes and laser diodes are respectively formed.

Figure 2:
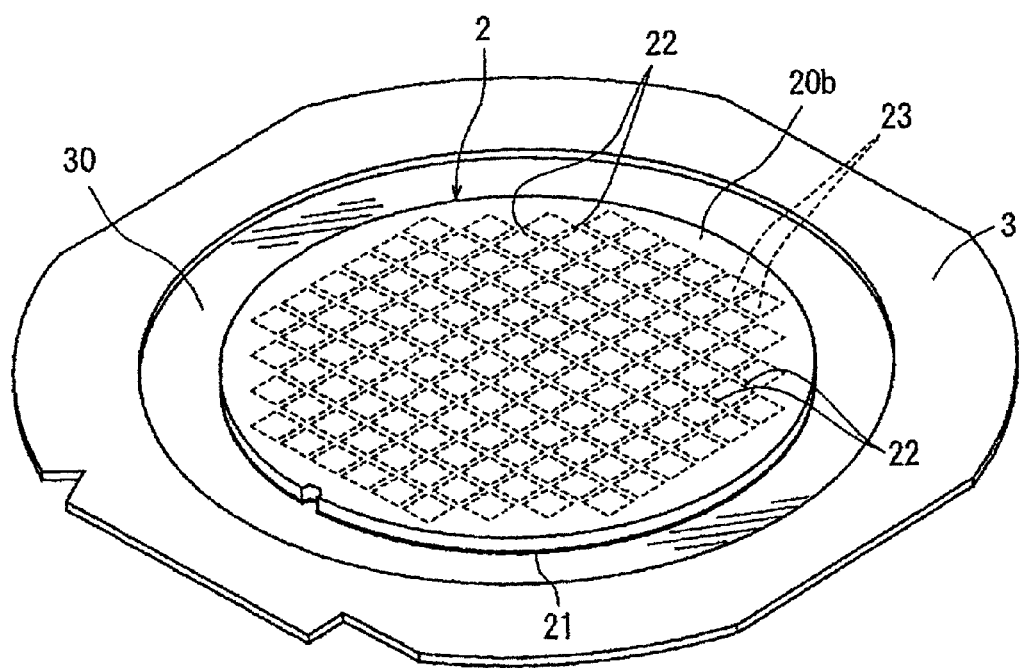
FIG. 2 is a perspective view showing a condition that the optical device wafer shown in FIG. 1A is attached to a dicing tape supported to an annular frame.

Prior to dividing the optical device wafer 2 along the division lines 22, a wafer supporting step is performed in such a manner that the optical device wafer 2 is attached to a dicing tape supported to an annular frame. More specifically, as shown in FIG. 2, a dicing tape 30 is supported at its peripheral portion to an annular frame 3 so as to close the inner opening of the annular frame 3, and the front side 21a (see FIGS. 1A and 1B) of the light emitting layer (epitaxial layer) 21 of the optical device wafer 2 is attached to the dicing tape 30 supported to the annular frame 3. Accordingly, the back side 20b of the sapphire substrate 20 of the optical device wafer 2 attached to the dicing tape 30 is exposed.

Figure 3:
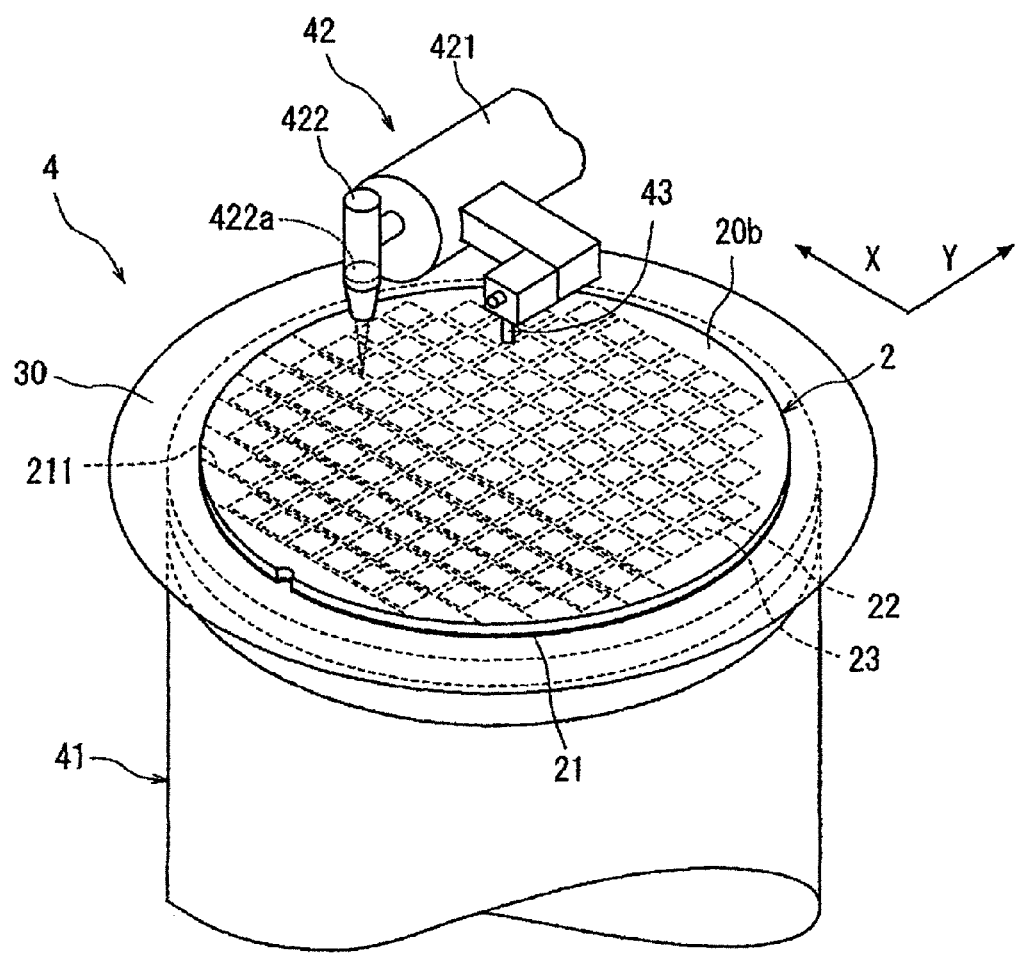
FIG. 3 is a perspective view showing an essential part of a laser processing apparatus for performing a light emitting layer removing step and a shield tunnel forming step in the optical device wafer processing method according to the present invention.

FIG. 3 shows an essential part of a laser processing apparatus 4 for performing the laser processing along the division lines 22 of the optical device wafer 2 after performing the wafer supporting step mentioned above. As shown in FIG. 3, the laser processing apparatus 4 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam oscillating means including a pulsed laser oscillator and repetition frequency setting means. The laser beam applying means 42 further includes focusing means 422 mounted on the front end of the casing 421. The focusing means 422 has a focusing lens 422a for focusing a pulsed laser beam oscillated by the pulsed laser beam oscillating means. The numerical aperture (NA) of the focusing lens 422a of the focusing means 422 is set in the following manner. That is, the numerical aperture (NA) of the focusing lens 422a is set so that the value obtained by dividing the numerical aperture (NA) of the focusing lens 422a by the refractive index (N) of the single crystal substrate falls within the range of 0.05 to 0.2 (numerical aperture setting step). The laser beam applying means 42 further includes focal position adjusting means (not shown) for adjusting the focal position of the pulsed laser beam to be focused by the focusing lens 422a of the focusing means 422.

The imaging means 43 is mounted on a front end portion of the casing 421 constituting the laser beam applying means 42. The imaging means 43 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 43 is transmitted to control means (not shown).

In performing the laser processing along the division lines 22 of the optical device wafer 2 by using the laser processing apparatus 4, the optical device wafer 2 attached to the dicing tape 30 is placed on the chuck table 41 of the laser processing apparatus 4 shown in FIG. 3 in the condition where the dicing tape 30 is in contact with the upper surface of the chuck table 41. Thereafter, suction means (not shown) is operated to hold the optical device wafer 2 through the dicing tape 30 on the chuck table 41 under suction (wafer holding step). Accordingly, the back side 20b of the sapphire substrate 20 of the optical device wafer 2 held on the chuck table 41 is oriented upward. Although the annular frame 3 supporting the dicing tape 30 is not shown in FIG. 3, the annular frame 3 is held by any suitable frame holding means provided on the chuck table 41. Thereafter, the chuck table 41 holding the optical device wafer 2 is moved to a position directly below the imaging means 43 by operating the feeding means (not shown).

In the condition where the chuck table 41 is positioned directly below the imaging means 43, an alignment operation is performed by the imaging means 43 and the control means (not shown) to detect a subject area of the optical device wafer 2 to be laser-processed. More specifically, the imaging means 43 and the control means perform image processing such as pattern matching for making the alignment of the division lines 22 extending in a first direction on the optical device wafer 2 and the focusing means 422 of the laser beam applying means 42 for applying the laser beam to the wafer 2 along the division lines 22, thus performing the alignment of a laser beam applying position (alignment step). Similarly, this alignment step is performed for the other division lines 22 extending in a second direction perpendicular to the first direction on the optical device wafer 2. Although the front side 21a of the light emitting layer (epitaxial layer) 21 of the optical device wafer 2 on which the division lines 22 are formed is oriented downward, the division lines 22 can be imaged through the sapphire substrate 20 as a single crystal substrate from the back side 20b thereof because the imaging means 43 includes the infrared light applying means for applying infrared light to the wafer 2, the optical system for capturing the infrared light applied to the wafer 2, and the imaging device (infrared CCD) for outputting an electrical signal corresponding to the infrared light captured by the optical system as described above.

Figure 4A:
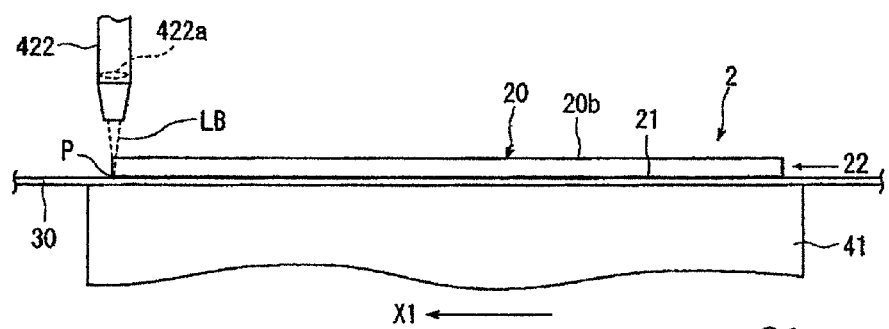
FIGS. 4A to 4C are views for illustrating the light emitting layer removing step.

After performing the alignment step mentioned above for all of the division lines 22, a light emitting layer removing step is performed in such a manner that a pulsed laser beam is applied to the optical device wafer 2 along the division lines 22 from the back side 20b of the sapphire substrate 20 as a single crystal substrate in the condition where the focal point of the pulsed laser beam is set near the light emitting layer 21, thereby partially removing the light emitting layer 21 along the division lines 22. More specifically, the chuck table 41 is moved to a laser beam applying area where the focusing means 422 of the laser beam applying means 42 is located as shown in FIG. 4A, thereby positioning one end (left end as viewed in FIG. 4A) of a predetermined one of the division lines 22 extending in the first direction directly below the focusing means 422. Further, the focal position adjusting means (not shown) is operated to move the focusing means 422 in the direction along the optical axis of the focusing lens 422a so that the focal point P of a pulsed laser beam LB to be focused by the focusing lens 422a is set at a position near the front side 20a of the sapphire substrate 20 (the back side of the light emitting layer 21) (focal position adjusting step).

Figure 4B:
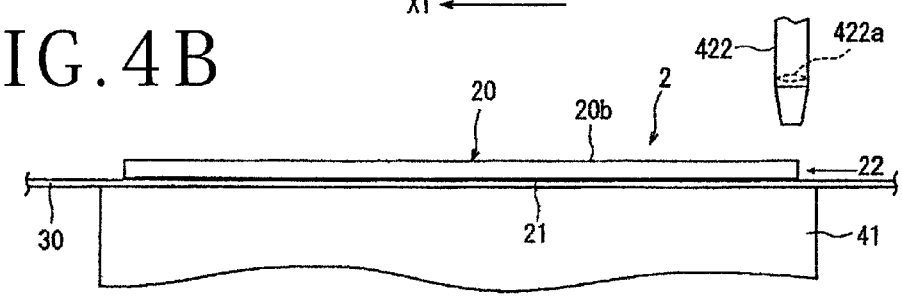

After performing the focal position adjusting step mentioned above, the laser beam applying means 42 is operated to apply the pulsed laser beam LB from the focusing means 422 to the optical device wafer 2, thereby performing the light emitting layer removing step mentioned above. That is, the pulsed laser beam LB having a transmission wavelength to the sapphire substrate 20 as a single crystal substrate is applied from the focusing means 422 to the optical device wafer 2 along the predetermined division line 22, and the chuck table 41 is moved at a predetermined feed speed in the direction shown by an arrow X1 in FIG. 4A (light emitting layer removing step). When the other end (right end as viewed in FIG. 4B) of the predetermined division line 22 reaches the position directly below the focusing means 422 as shown in FIG. 4B, the application of the pulsed laser beam LB is stopped and the movement of the chuck table 41 is also stopped.

For example, the light emitting layer removing step mentioned above is performed under the following processing conditions.

Figure 4C:
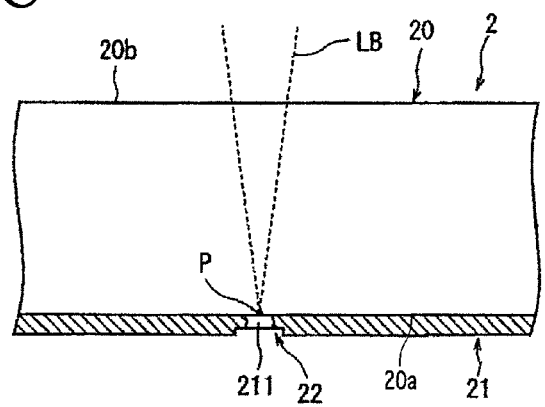

Wavelength: 1030 nm
Repetition frequency: 50 kHz
Energy per pulse: 2 to 6 µJ
Focused spot diameter: 10 µm
Work feed speed: 250 mm/s By performing the light emitting layer removing step under the above processing conditions, the overlap ratio of the focused spots of the pulsed laser beam LB applied along the predetermined division line 22 becomes 50%. Accordingly, the light emitting layer 21 formed on the front side 20a of the sapphire substrate 20 is continuously broken along the predetermined division line 22 to thereby form a groove 211 where the light emitting layer 21 has been removed as shown in FIG. 4C.

After performing the light emitting layer removing step along the predetermined division line 22 as mentioned above, the chuck table 41 is moved in the indexing direction shown by the arrow Y in FIG. 3 by the pitch of the division lines 22 formed on the optical device wafer 2 (indexing step), and the light emitting layer removing step is similarly performed along the next division line 22 extending in the first direction. In this manner, the light emitting layer removing step is performed along all of the division lines 22 extending in the first direction. Thereafter, the chuck table 41 is rotated 90 degrees to similarly perform the light emitting layer removing step along all of the other division lines 22 extending in the second direction perpendicular to the first direction.

Preferably, the energy of the pulsed laser beam to be applied in the light emitting layer removing step is set to 2 to 6 µJ/pulse. Setting of this energy of the pulsed laser beam to be applied in the light emitting layer removing step will be hereinafter described in detail.

Figure 5A:
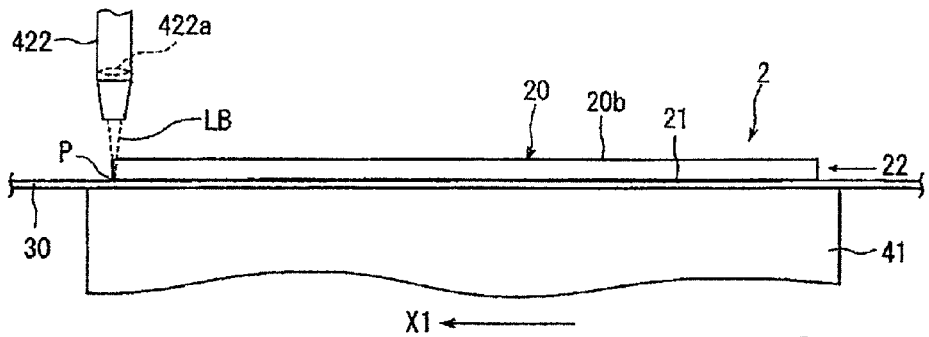
FIGS. 5A to 5E are views for illustrating the shield tunnel forming step.

After performing the light emitting layer removing step, a shield tunnel forming step is performed in such a manner that a pulsed laser beam is applied to the optical device wafer 2 along the division lines 22 from the back side 20b of the sapphire substrate 20 as a single crystal substrate in the condition where the focal point of the pulsed laser beam is set near the front side 20a of the sapphire substrate 20, thereby forming a plurality of shield tunnels arranged along each division line 22, each shield tunnel extending from the front side 20a of the sapphire substrate 20 to the back side 20b thereof, each shield tunnel being composed of a fine hole and an amorphous region formed around the fine hole for shielding the fine hole. More specifically, the chuck table 41 holding the optical device wafer 2 processed by the light emitting layer removing step is moved to a laser beam applying area where the focusing means 422 of the laser beam applying means 42 is located as shown in FIG. 5A, thereby positioning one end (left end as viewed in FIG. 5A) of a predetermined one of the division lines 22 extending in the first direction directly below the focusing means 422. Further, the focal position adjusting means (not shown) is operated to move the focusing means 422 in the direction along the optical axis of the focusing lens 422a so that the focal point P of a pulsed laser beam LB to be focused by the focusing lens 422a is set at a position near the front side 20a of the sapphire substrate 20 (focal position adjusting step).

Figure 5B:
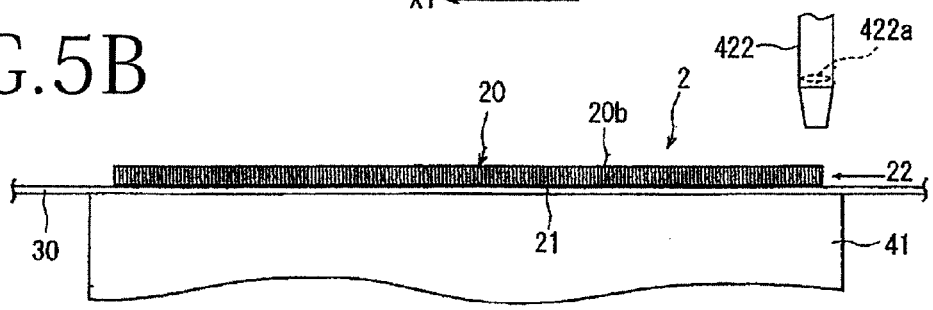

After performing the focal position adjusting step mentioned above, the laser beam applying means 42 is operated to apply the pulsed laser beam LB from the focusing means 422 to the optical device wafer 2, thereby performing the shield tunnel forming step mentioned above so that each shield tunnel composed of the fine hole and the amorphous region extends from the focal point P set near the front side 20a of the sapphire substrate 20 to the beam incident surface (the back side 20b of the sapphire substrate 20). That is, the pulsed laser beam LB having a transmission wavelength to the sapphire substrate 20 as a single crystal substrate is applied from the focusing means 422 to the optical device wafer 2 along the predetermined division line 22, and the chuck table 41 is moved at a predetermined feed speed in the direction shown by an arrow X1 in FIG. 5A (shield tunnel forming step). When the other end (right end as viewed in FIG. 5B) of the predetermined division line 22 reaches the position directly below the focusing means 422 as shown in FIG. 5B, the application of the pulsed laser beam LB is stopped and the movement of the chuck table 41 is also stopped.

For example, the shield tunnel forming step mentioned above is performed under the following processing conditions.

Figure 5C:
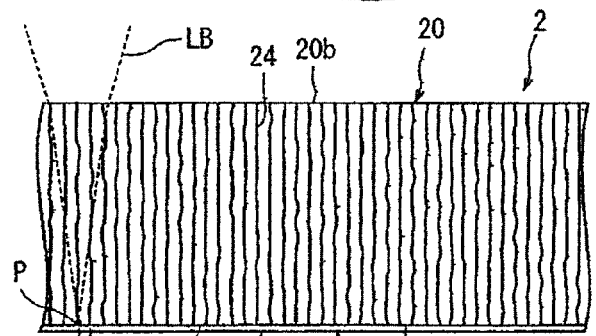
Figure 5D:
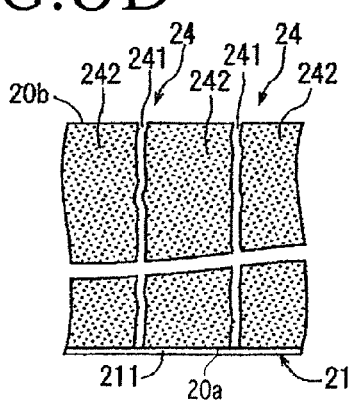
Figure 5E:
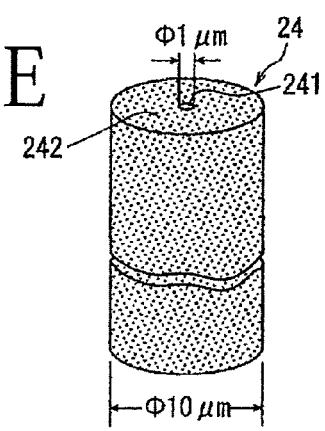

Wavelength: 1030 nm
Repetition frequency: 50 kHz
Energy per pulse: 30 µJ or more
Focused spot diameter: 10 µm
Work feed speed: 500 mm/s By performing the shield tunnel forming step mentioned above along the predetermined division line 22, a plurality of fine holes 241 and a plurality of amorphous regions 242 are grown in the sapphire substrate 20 so as to extend from the front side 20a where the focal point P of the pulsed laser beam LB is set to the back side 20b as the beam incident surface as shown in FIGS. 5C and 5D, wherein the amorphous regions 242 are formed around the fine holes 241, respectively. As a result, a plurality of amorphous shield tunnels 24 are formed along the predetermined division line 22 at predetermined intervals, e.g., 10 µm intervals (=(work feed speed: 500 mm/s)/(repetition frequency: 50 kHz)) as shown in FIG. 5C. As shown in FIGS. 5D and 5E, each shield tunnel 24 is composed of the central fine hole 241 having a diameter of about 1 µm and the amorphous region 242 formed around the central fine hole 241 and having a diameter of 10 µm. In this preferred embodiment, the amorphous regions 242 of any adjacent ones of the plural shield tunnels 24 are connected with each other.

Each amorphous shield tunnel 24 formed by the shield tunnel forming step mentioned above can be grown so as to extend from the front side 20a of the sapphire substrate 20 of the optical device wafer 2 to the back side 20b thereof as the beam incident surface. Accordingly, even when the thickness of the wafer 2 is large, it is sufficient to once apply the pulsed laser beam LB along each division line 22, so that the productivity can be greatly improved. Even when the thickness of the optical device wafer 2 is as large as 300 µm, the shield tunnel 24 can be formed so as to extend from the front side 20a of the sapphire substrate 20 to the back side 20b thereof as mentioned above, so that warpage does not occur in the optical device wafer 2. Furthermore, no debris is scattered in the shield tunnel forming step, so that it is possible to solve the problem that the optical devices 23 may be degraded in quality. In performing the shield tunnel forming step, the light emitting layer 21 formed on the front side 20a of the sapphire substrate 20 has already been removed along each division line 22. Accordingly, the light emitting layer 21 forming the optical devices 23 adjacent to the division lines 22 is not damaged in the shield tunnel forming step.

After performing the shield tunnel forming step along the predetermined division line 22 as mentioned above, the chuck table 41 is moved in the indexing direction shown by the arrow Y in FIG. 3 by the pitch of the division lines 22 formed on the optical device wafer 2 (indexing step), and the shield tunnel forming step is similarly performed along the next division line 22 extending in the first direction. In this manner, the shield tunnel forming step is performed along all of the division lines 22 extending in the first direction. Thereafter, the chuck table 41 is rotated 90 degrees to similarly perform the shield tunnel forming step along all of the other division lines 22 extending in the second direction perpendicular to the first direction.

To form a good shield tunnel 24 in the shield tunnel forming step, it is important that the value (S=NA/N) obtained by dividing the numerical aperture (NA) of the focusing lens 422a by the refractive index (N) of the single crystal substrate falls within the range of 0.05 to 0.2 as described above.

Figure 6:
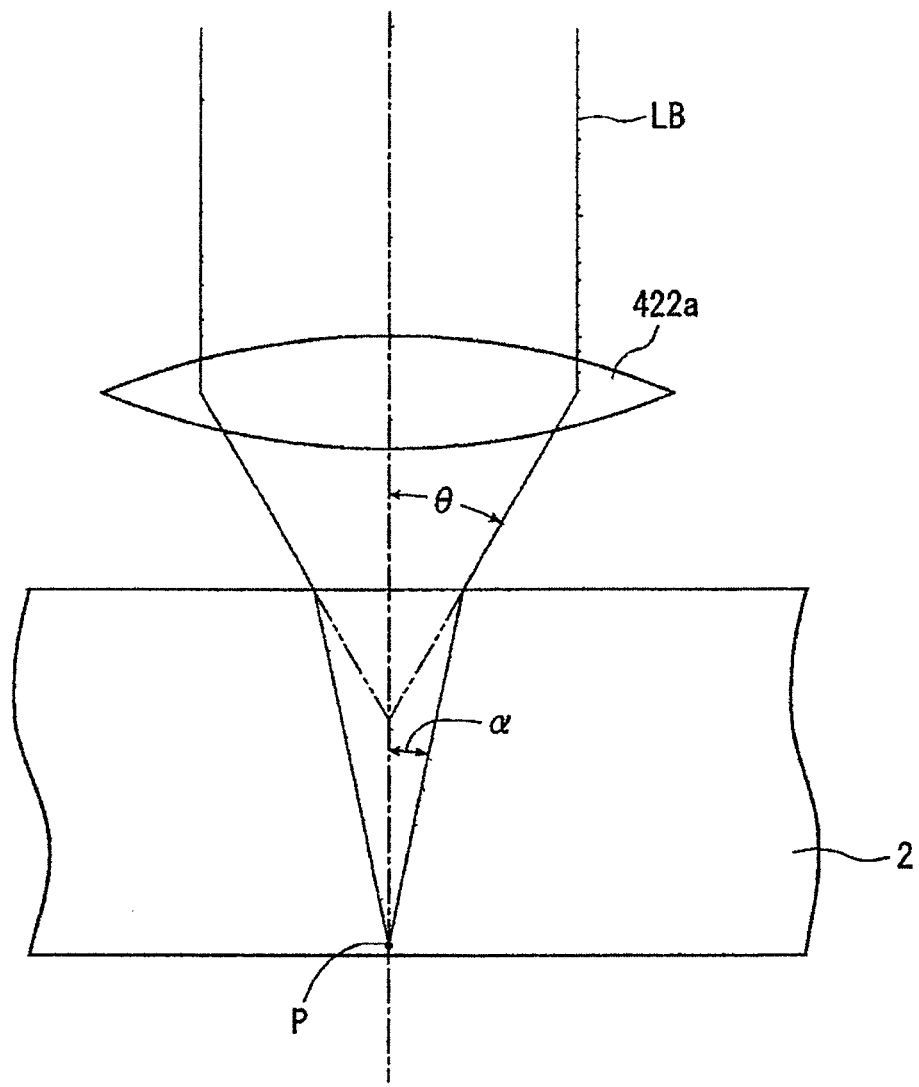
FIG. 6 is a diagram showing the relation between the numerical aperture (NA) of a focusing lens, the refractive index (N) of the optical device wafer, and the value obtained by dividing the numerical aperture (NA) by the refractive index (N)

There will now be described with reference to FIG. 6 the relation between the numerical aperture (NA), the refractive index (N), and the value (S=NA/N) obtained by dividing the numerical aperture (NA) by the refractive index (N). As shown in FIG. 6, the pulsed laser beam LB entering the focusing lens 422a is focused at an angle θ with respect to the optical axis of the focusing lens 422a. In this case, the numerical aperture (NA) of the focusing lens 422a is expressed as sin θ (i.e., NA=sin θ). When the pulsed laser beam LB focused by the focusing lens 422a is applied to the sapphire substrate 20 of the optical device wafer 2 as the single crystal substrate, the pulsed laser beam LB is refracted at an angle α with respect to the optical axis because the density of the single crystal substrate constituting the optical device wafer 2 is higher than that of air, and then focused at the focal point P. This angle α with respect to the optical axis differs according to the refractive index (N) of the single crystal substrate constituting the optical device wafer 2. Since the refractive index (N) is expressed as N=sin θ/sin α, the value (S=NA/N) obtained by dividing the numerical aperture (NA) by the refractive index (N) of the single crystal substrate is given by sin α. Accordingly, it is important that sin α is set in the range of 0.05 to 0.2 (i.e., 0.05≤sin α≤0.2).

There will now be described the reason why the value (S=NA/N) obtained by dividing the numerical aperture (NA) of the focusing lens 422a by the refractive index (N) of the single crystal substrate is set in the range of 0.05 to 0.2.

Example 1-1

By using a sapphire ($Al_2O_3$) substrate (refractive index: 1.7) having a thickness of 1000 μm, the shield tunnel forming step was performed under the following processing conditions to form a shield tunnel, and it was determined whether or not the shield tunnel is good.
Processing Conditions
  Wavelength: 1030 nm
  Repetition frequency: 50 kHz
  Pulse width: 10 ps
  Average power: 3 W
  Focused spot diameter: 10 μm
  Work feed speed: 500 mm/s

| Numerical aperture (NA) of the focusing lens | Good/poor condition of the shield tunnel | S = NA/N |
|---|---|---|
| 0.05 | Not formed | |
| 0.1 | Slightly good | 0.058 |
| 0.15 | Good | 0.088 |
| 0.2 | Good | 0.117 |
| 0.25 | Good | 0.147 |
| 0.3 | Good | 0.176 |
| 0.35 | Slightly good | 0.205 |
| 0.4 | Poor | |
| 0.45 | Poor: voids generated | |
| 0.5 | Poor: voids generated | |
| 0.55 | Poor: voids generated | |
| 0.6 | Poor: voids generated | |

It is apparent from the above results that in the case of using a sapphire ($Al_2O_3$) substrate (refractive index: 1.7) as the single crystal substrate a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2. Accordingly, it is important that the numerical aperture (NA) of the focusing lens 422a for focusing the pulsed laser beam is set in the range of 0.1 to 0.35 in the case of using a sapphire ($Al_2O_3$) substrate (refractive index: 1.7) as the single crystal substrate.

Example 1-2

By using a silicon carbide (SiC) substrate (refractive index: 2.63) having a thickness of 1000 μm, the shield tunnel forming step was performed under the following processing conditions to form a shield tunnel, and it was determined whether or not the shield tunnel is good.
Processing Conditions
  Wavelength: 1030 nm
  Repetition frequency: 50 kHz
  Pulse width: 10 ps
  Average power: 3 W
  Focused spot diameter: 10 μm
  Work feed speed: 500 mm/s

| Numerical aperture (NA) of the focusing lens | Good/poor condition of the shield tunnel | S = NA/N |
|---|---|---|
| 0.05 | Not formed | |
| 0.1 | Not formed | |
| 0.15 | Slightly good | 0.057 |
| 0.2 | Good | 0.076 |
| 0.25 | Good | 0.095 |
| 0.3 | Good | 0.114 |
| 0.35 | Good | 0.133 |
| 0.4 | Good | 0.153 |
| 0.45 | Good | 0.171 |
| 0.5 | Good | 0.19 |
| 0.55 | Slightly good | 0.209 |
| 0.6 | Poor: voids generated | |

It is apparent from the above results that in the case of using a silicon carbide (SiC) substrate (refractive index: 2.63) as the single crystal substrate a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2. Accordingly, it is important that the numerical aperture (NA) of the focusing lens 422a for focusing the pulsed laser beam is set in the range of 0.15 to 0.55 in the case of using a silicon carbide (SiC) substrate (refractive index: 2.63) as the single crystal substrate.

The shield tunnel is formed so as to extend from the focal point P to the beam incident surface to which the pulsed laser beam is applied. Accordingly, it is necessary to set the focal point P of the pulsed laser beam inside the optical device wafer 2 at a position near the other side surface opposite to the beam incident surface.

It was confirmed from Examples 1-1 and 1-2 that a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2.

There will now be examined the correlation between the energy of the pulsed laser beam and the length of the shield tunnel.

Example 2

The pulsed laser beam was applied to a sapphire ($Al_2O_3$) substrate and silicon carbide (SiC) substrate each having a thickness of 1000 μm under the following processing conditions to determine the relation between the energy (μJ/pulse) of the pulsed laser beam and the length (μm) of the shield tunnel.
Processing Conditions
  Wavelength: 1030 nm
  Repetition frequency: 50 kHz
  Pulse width: 10 ps
  Focused spot diameter: 10 μm
  Work feed speed: 500 mm/s The average power of the pulsed laser beam was increased from 0.05 W (1 μJ/pulse) at intervals of 0.05 W (1 μJ/pulse) until the shield tunnel was formed. After the shield tunnel was formed, the average power of the pulsed laser beam was increased at intervals of 0.5 W (10 μJ/pulse) up to 10 W (200 μJ/pulse). Then, the length (μm) of the shield tunnel was measured every time the average power was increased.

| Pulse energy (μJ/pulse) | Length (μm) of the shield tunnel | |
|---|---|---|
| | Sapphire | Silicon carbide |
| 1 | Not formed | Not formed |
| 2 | Not formed | Not formed |
| 3 | Not formed | Not formed |
| 4 | Not formed | Not formed |
| 5 | Not formed | Not formed |
| 6 | Not formed | Not formed |
| 8 | Not formed | Not formed |
| 9 | Not formed | Not formed |
| 10 | 75 | 85 |
| 20 | 125 | 115 |
| 30 | 150 | 155 |
| 40 | 175 | 185 |
| 50 | 190 | 230 |
| 60 | 210 | 265 |
| 70 | 245 | 290 |
| 80 | 260 | 330 |
| 90 | 315 | 370 |
| 100 | 340 | 395 |
| 110 | 365 | 430 |
| 120 | 400 | 470 |
| 130 | 425 | 500 |
| 140 | 455 | 535 |
| 150 | 490 | 570 |
| 160 | 525 | 610 |
| 170 | 550 | 640 |
| 180 | 575 | 675 |
| 190 | 610 | 715 |
| 200 | 640 | 740 |

Figure 7:
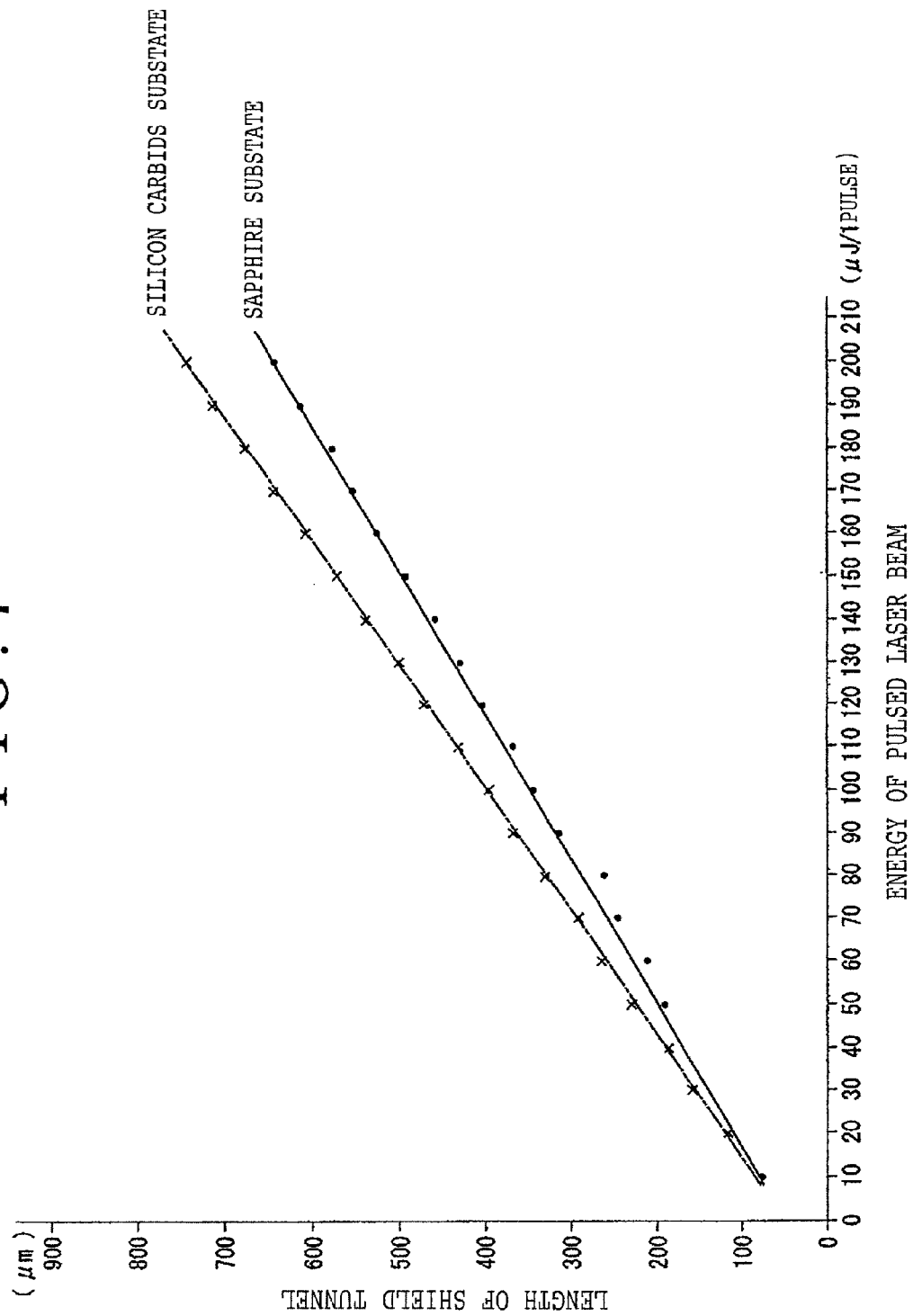
FIG. 7 is a graph showing the relation between the energy of a pulsed laser beam and the length of a shield tunnel in the condition where the shield tunnel is formed in a sapphire ($Al_2O_3$) substrate and a silicon carbide (SiC) substrate.

In the condition where the shield tunnel was formed in the sapphire ($Al_2O_3$) substrate and silicon carbide (SiC) substrate, the relation between the energy (μJ/pulse) of the pulsed laser beam and the length (μm) of the shield tunnel is shown by the graph in FIG. 7. As apparent from the graph shown in FIG. 7, the minimum value for the energy of the pulsed laser beam to form the shield tunnel is 5 μJ/pulse. Furthermore, letting X and Y denote the energy (μJ/pulse) of the pulsed laser beam and the length (μm) of the shield tunnel, respectively, the correlation between X and Y is expressed as Y=(3.0 to 4.0 μm/μJ)X+50 μm. Accordingly, in the case of using a sapphire ($Al_2O_3$) substrate having a thickness of 500 μm as the single crystal substrate, the energy of the pulsed laser beam is set to 160 μJ/pulse or more, so as to make the length of the shield tunnel equal to the thickness of the single crystal substrate.

There will now be examined the relation between the wavelength of the pulsed laser beam and the formation of the shield tunnel.

Example 3-1

The pulsed laser beam was applied to a sapphire ($Al_2O_3$) substrate having a thickness of 1000 μm under the following processing conditions. In the case of decreasing the wavelength of the pulsed laser beam from 2940 nm through 1550 nm, 1030 nm, 515 nm, 343 nm, and 257 nm to 151 nm, it was determined whether or not the shield tunnel can be formed in the sapphire ($Al_2O_3$) substrate with a band gap of 8.0 eV (reduced wavelength: 155 nm).
Processing Conditions
  Repetition frequency: 50 kHz
  Pulse width: 10 ps
  Average power: 3 W
  Focused spot diameter: 10 μm
  Work feed speed: 500 mm/s

| Wavelength (nm) | Good/poor condition of the shield tunnel |
|---|---|
| 2940 | Good |
| 1550 | Good |
| 1030 | Good |
| 515 | Good |
| 343 | Good |
| 257 | Poor |
| 151 | Poor ablation on the beam incident surface |

It is apparent from the above results that in the case of using a sapphire ($Al_2O_3$) substrate as the single crystal substrate, a good shield tunnel can be formed by setting the wavelength of the pulsed laser beam to a value two or more times the wavelength (reduced wavelength: 155 nm) corresponding to a band gap of 0.8 eV.

Example 3-2

The pulsed laser beam was applied to a silicon carbide (SiC) substrate having a thickness of 1000 μm under the following processing conditions. In the case of decreasing the wavelength of the pulsed laser beam from 2940 nm through 1550 nm, 1030 nm, and 515 nm to 257 nm, it was determined whether or not the shield tunnel can be formed in the silicon carbide (SiC) substrate with a band gap of 2.9 eV (reduced wavelength: 425 nm).
Processing Conditions
  Repetition frequency: 50 kHz
  Pulse width: 10 ps Average power: 3 W
Focused spot diameter: 10 μm
Work feed speed: 500 mm/s

| Wavelength (nm) | Good/poor condition of the shield tunnel |
|---|---|
| 2940 | Good |
| 1550 | Good |
| 1030 | Good |
| 515 | Poor ablation on the beam incident surface |
| 257 | Poor ablation on the beam incident surface |

It is apparent from the above results that in the case of using a silicon carbide (SiC) substrate as the single crystal substrate, a good shield tunnel can be formed by setting the wavelength of the pulsed laser beam to a value two or more times the wavelength (reduced wavelength: 425 nm) corresponding to a band gap of 2.9 eV.

It was confirmed from Examples 3-1 and 3-2 that a good shield tunnel can be formed by setting the wavelength of the pulsed laser beam to a value two or more times the wavelength corresponding to the band gap of the single crystal substrate.

There will now be described the energy of the pulsed laser beam per pulse to be applied in the light emitting layer removing step mentioned above. As apparent from the result of Example 2, a shield tunnel can be formed under the condition that the energy of the pulsed laser beam is 10 μJ/pulse or more. To divide the optical device wafer 2 into the individual optical devices 23, the shield tunnel is required to have a length of 150 μm or more. In this case, the energy of the pulsed laser beam is 30 μJ/pulse or more.

However, when the pulsed laser beam having an energy of 30 μJ/pulse is applied to the optical device wafer 2 along each division line 22 from the back side 20b of the sapphire substrate 20 in the condition where the focal point of the pulsed laser beam is set near the front side 20a of the sapphire substrate 20 without performing the light emitting layer removing step, the light emitting layer 21 formed on the front side 20a of the sapphire substrate 20 along the division lines 22 and the light emitting layer 21 forming the optical devices 23 adjacent to the division lines 22 are broken like a chain reaction, causing a reduction in quality of the optical devices 23.

The present inventors estimated that such a chain-reaction break of the light emitting layer 21 forming the optical devices 23 in forming the shield tunnel can be prevented by performing the light emitting layer removing step before the shield tunnel forming step to remove only the light emitting layer 21 along the division lines 22. Further, the present inventors carried out the following experiments to remove only the light emitting layer 21 along the division lines 22.

Example 4-1

The pulsed laser beam having an energy of 10 μJ/pulse and 20 μJ/pulse capable of forming the shield tunnel was applied to the optical device wafer 2 along the division lines 22 from the back side 20b of the sapphire substrate 20 in the condition where the focal point of the pulsed laser beam was set near the front side 20a of the sapphire substrate 20. In this case, the light emitting layer 21 along the division lines 22 could not be broken. This is considered to be due to the fact that most of the energy of the pulsed laser beam was used for the formation of the shield tunnel.

Example 4-2

The pulsed laser beam having an energy of 1 to 9 μJ/pulse not capable of forming the shield tunnel was applied to the optical device wafer 2 along the division lines 22 from the back side 20b of the sapphire substrate 20 in the condition where the focal point of the pulsed laser beam was set near the front side 20a of the sapphire substrate 20. In this case, only the light emitting layer 21 along the division lines 22 could be broken in the range of 2 to 6 μJ/pulse.

In the range of 7 to 9 μJ/pulse, the light emitting layer 21 along the division lines 22 and the light emitting layer 21 forming the optical devices 23 adjacent to the division lines 22 were broken like a chain reaction. Accordingly, it is important that the energy of the pulsed laser beam to be applied in the light emitting layer removing step must be set to 2 to 6 μJ/pulse.

Figure 8:
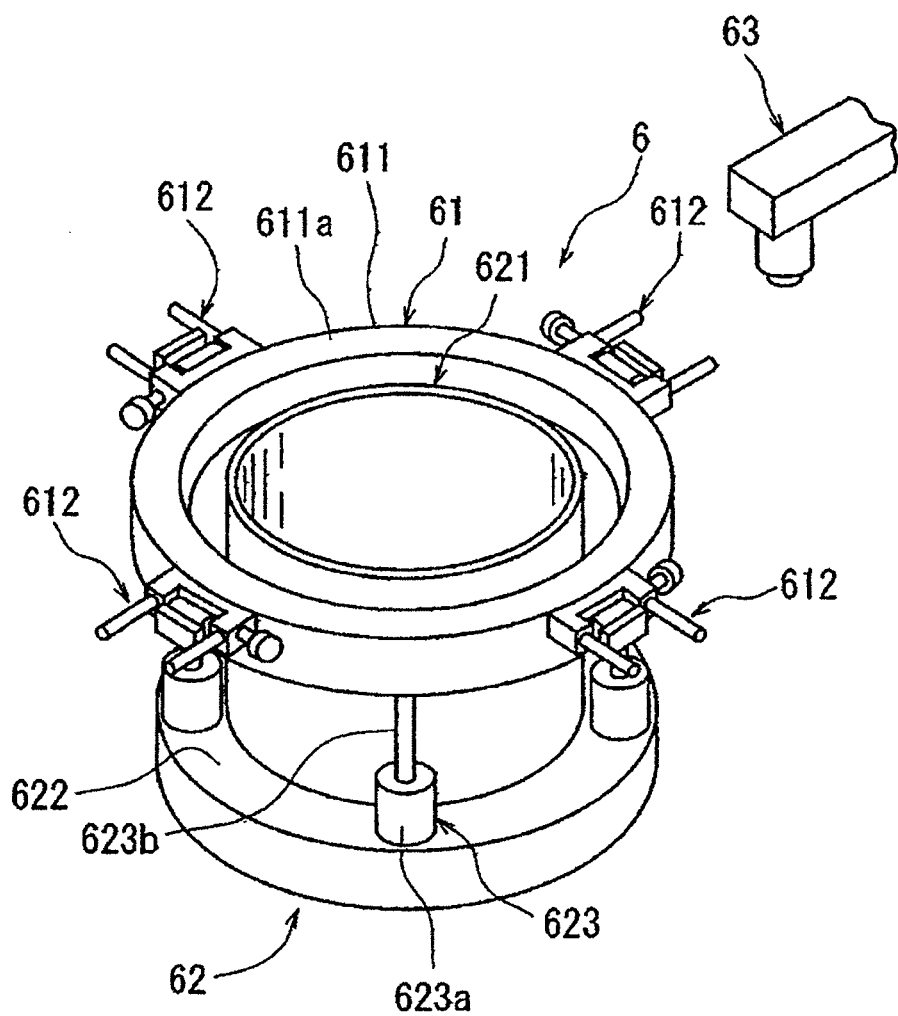
FIG. 8 is a perspective view of a dividing apparatus for performing a dividing step in the optical device wafer processing method according to the present invention.

After performing the shield tunnel forming step mentioned above, a wafer dividing step is performed in such a manner that an external force is applied to the optical device wafer 2 to divide the wafer 2 along each division line 22 where the plural shield tunnels 24 are continuously formed, wherein each shield tunnel 24 is composed of the fine hole 241 and the amorphous region 242 formed around the fine hole 241, thereby obtaining the individual optical devices 23. This wafer dividing step is performed by using a dividing apparatus 6 shown in FIG. 8. The dividing apparatus 6 shown in FIG. 8 includes frame holding means 61 for holding the annular frame 3, tape expanding means 62 for expanding the dicing tape 30 supported to the annular frame 3 held by the frame holding means 61, and a pickup collet 63. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame 3 thereon. The annular frame 3 mounted on the mounting surface 611a is fixed to the frame holding member 611 by the clamps 612. The frame holding means 61 is supported by the tape expanding means 62 so as to be vertically movable.

Figure 9A:
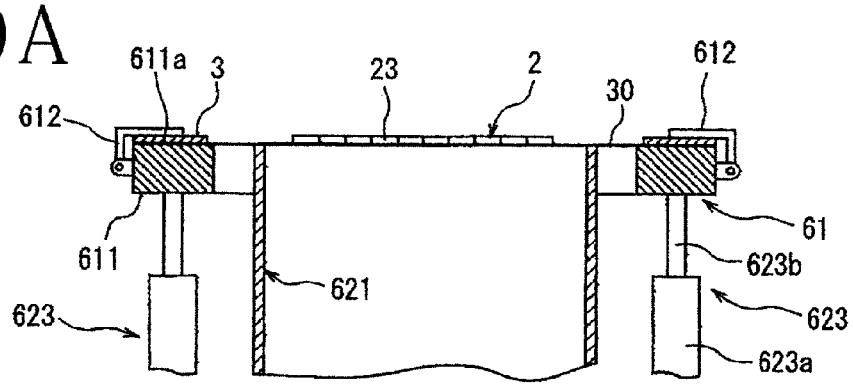
FIGS. 9A to 9C are sectional side views for illustrating the dividing step.
Figure 9B:
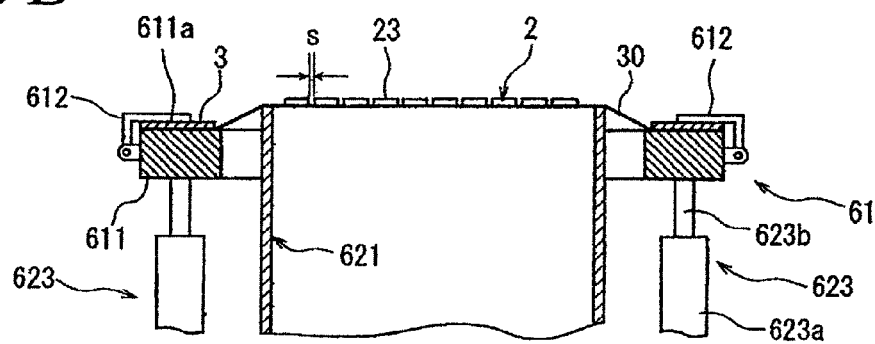

The tape expanding means 62 includes an expanding drum 621 provided inside of the annular frame holding member 611. The expanding drum 621 has an outer diameter smaller than the inner diameter of the annular frame 3 and an inner diameter larger than the outer diameter of the optical device wafer 2 attached to the dicing tape 30 supported to the annular frame 3. The expanding drum 621 has a supporting flange 622 at the lower end of the drum 621. The tape expanding means 62 further includes supporting means 623 for vertically movably supporting the annular frame holding member 611. The supporting means 623 is composed of a plurality of air cylinders 623a provided on the supporting flange 622. Each air cylinder 623a is provided with a piston rod 623b connected to the lower surface of the annular frame holding member 611. The supporting means 623 composed of these plural air cylinders 623a functions to vertically move the annular frame holding member 611 so as to selectively take a reference position where the mounting surface 611a is substantially equal in height to the upper end of the expanding drum 621 as shown in FIG. 9A and an expansion position where the mounting surface 611a is lower in height than the upper end of the expanding drum 621 by a predetermined amount as shown in FIG. 9B.

The wafer dividing step using the dividing apparatus 6 will now be described with reference to FIGS. 9A to 9C. As shown in FIG. 9A, the annular frame 3 supporting the optical device wafer 2 through the dicing tape 30 is mounted on the mounting surface 611a of the frame holding member 611 of the frame holding means 61. Thereafter, the annular frame 3 is fixed to the frame holding member 611 by the clamps 612 (frame holding step). At this time, the frame holding member 611 is set at the reference position shown in FIG. 9A. Thereafter, the air cylinders 623a as the supporting means 623 of the tape expanding means 62 are operated to lower the frame holding member 611 to the expansion position shown in FIG. 9B. Accordingly, the annular frame 3 fixed to the mounting surface 611a of the frame holding member 611 is also lowered, so that the dicing tape 30 supported to the annular frame 3 comes into abutment against the upper end of the expanding drum 621 and is expanded as shown in FIG. 9B (tape expanding step). As a result, a tensile force radially acts on the optical device wafer 2 attached to the dicing tape 30. Accordingly, the optical device wafer 2 is divided into the individual optical devices 23 along each division line 22 where the plural shield tunnels 24 are continuously formed to be reduced in strength. At the same time, a spacing S is formed between any adjacent ones of the individual optical devices 23.

Figure 9C:
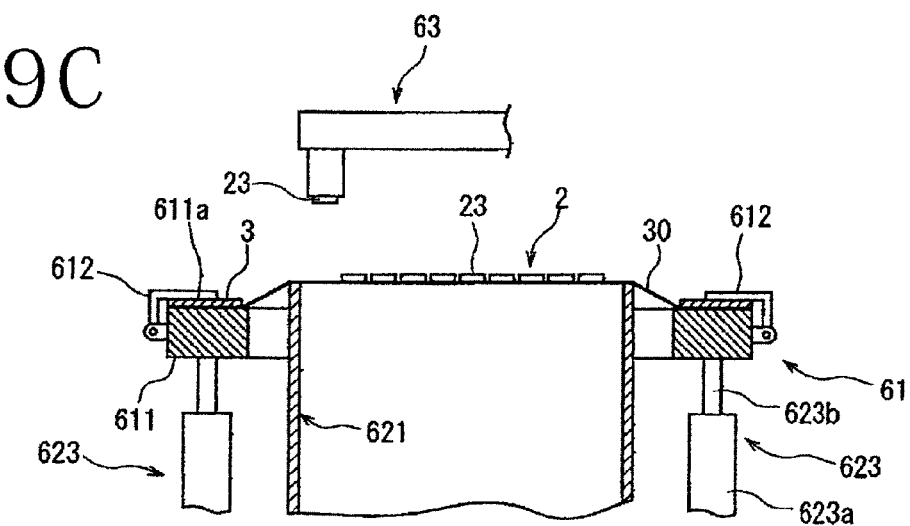

Thereafter, the pickup collet 63 is operated to hold each optical device 23 under suction and peel it from the dicing tape 30, thereby individually picking up the optical devices 23 as shown in FIG. 9C (pickup step). Each optical device 23 is next transferred to a tray (not shown) or any apparatus for performing a die bonding step. In the pickup step, each optical device 23 can be easily picked up without the contact with its adjacent optical device 23 because the spacing S is formed between any adjacent ones of the individual optical devices 23 attached to the dicing tape 30.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for dividing an optical device wafer into individual optical devices along a plurality of crossing division lines, said optical device wafer being composed of a single crystal substrate and a light emitting layer formed on a front side of said single crystal substrate, said optical device wafer being partitioned by said division lines to define a plurality of separate regions where said optical devices are respectively formed, said optical device wafer processing method comprising:

a numerical aperture setting step of setting the numerical aperture (NA) of a focusing lens for focusing a pulsed laser beam so that the value obtained by dividing the numerical aperture (NA) of said focusing lens by the refractive index (N) of said single crystal substrate falls within the range of 0.05 to 0.2;

a light emitting layer removing step of applying said pulsed laser beam to said optical device wafer along said division lines from a back side of said single crystal substrate in a condition where a single focal point of said pulsed laser beam is set near said light emitting layer, thereby partially removing said light emitting layer along said division lines;

a shield tunnel forming step of applying said pulsed laser beam to said optical device wafer along said division lines from the back side of said single crystal substrate in a condition where a single focal point of said pulsed laser beam is set near the front side of said single crystal substrate after performing said light emitting layer removing step, thereby forming a plurality of shield tunnels arranged along each division line, each shield tunnel extending continuously from the front side of said single crystal substrate to the back side thereof, each shield tunnel being composed of a fine hole and an amorphous regions formed around said fine hole for shielding said fine hole; and a dividing step of applying an external force to said optical device wafer after performing said shield tunnel forming step, thereby dividing said optical device wafer into said individual optical devices;

said pulsed laser beam being applied in said light emitting layer removing step with an energy smaller than that of said pulsed laser beam to be applied in said shield tunnel forming step in a condition where the focused spots of said pulsed laser beam are overlapped.

2. The optical device wafer processing method according to claim 1, wherein the energy of said pulsed laser beam to be applied in said light emitting layer removing step is set to 2 to 6 µJ/pulse, and the energy of said pulsed laser beam to be applied in said shield tunnel forming step is set to 30 µJ/pulse or more.

* * * * *